United States Patent [19]
Pritchard

[11] Patent Number: 5,802,182
[45] Date of Patent: Sep. 1, 1998

[54] AUDIO PROCESS DISTORTION

[76] Inventor: Eric K. Pritchard, Rte. 1 Box 536, Berkeley Springs, W. Va. 25411

[21] Appl. No.: 759,128

[22] Filed: Dec. 2, 1996

Related U.S. Application Data

[63] Continuation-in-part of Ser. No. 281,019, Jul. 27, 1994.

[51] Int. Cl.⁶ ..................................................... H03G 3/00
[52] U.S. Cl. ..................................................... 381/61; 381/65
[58] Field of Search ..................................... 381/61, 64, 65, 381/63, 98, 106

[56] References Cited

U.S. PATENT DOCUMENTS

| | | |
|---|---|---|
| 1,830,402 | 11/1931 | Miessner . |
| 1,977,469 | 10/1934 | Bussard . |
| 3,789,143 | 1/1974 | Blackmer . |
| 4,096,438 | 6/1978 | Humphrey . |
| 4,150,253 | 4/1979 | Knoppel . |
| 4,586,192 | 4/1986 | Arnston . |
| 4,627,094 | 12/1986 | Scholz . |
| 4,731,852 | 3/1988 | Liljeryd . |
| 5,091,700 | 2/1992 | Smith . |
| 5,133,015 | 7/1992 | Scholz . |
| 5,173,178 | 12/1992 | Kawashima et al. . |
| 5,243,660 | 9/1993 | Zagorski . |
| 5,487,114 | 1/1996 | Dinh . |
| 5,596,646 | 1/1997 | Waller, Jr. . |

OTHER PUBLICATIONS

Audio, Radio and TV Circuits, LM380, 3 pages.
Library of Congress Cataloging-in-Publicata Data, Rashid, M.H., SPICE for circuits and electronics using PSpice/ Muhammad H. Rashid, 5 pages.
Properties of Magnetic Disks and Tapes, 1 page.
Recording with AC-Bias, p. 472.

Primary Examiner—Forester W. Isen
Attorney, Agent, or Firm—Barnes & Thornburg

[57] ABSTRACT

The audio process is a signal path having a plurality of filters connected or including distortion means. The prime example of this phenomenon surrounds inductances such as found in magnetic tape recorders, spring reverberators, and transformers. The inductors require a pre-emphasis filter to produce a constant current. Secondarily there are the complementary filters associated with the average spectrum of audio which are used to maximize the signal to noise ratio. Ideally the net response of the filters is flat, however, roll-offs at the audio extremes are quite common.

The audio process distortion emulates the distortion of the active devices between the filters such as vacuum tube and magnet non-linearities. Since the distortion devices follow filters, the spectra of distortion is different than the frequency response.

27 Claims, 3 Drawing Sheets

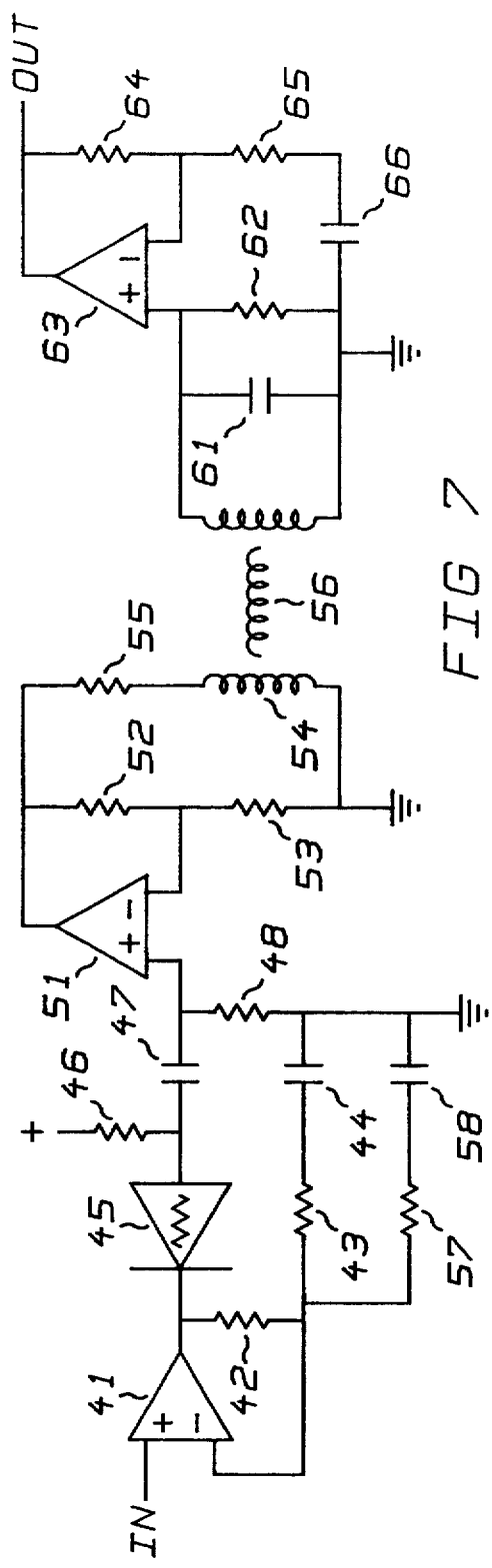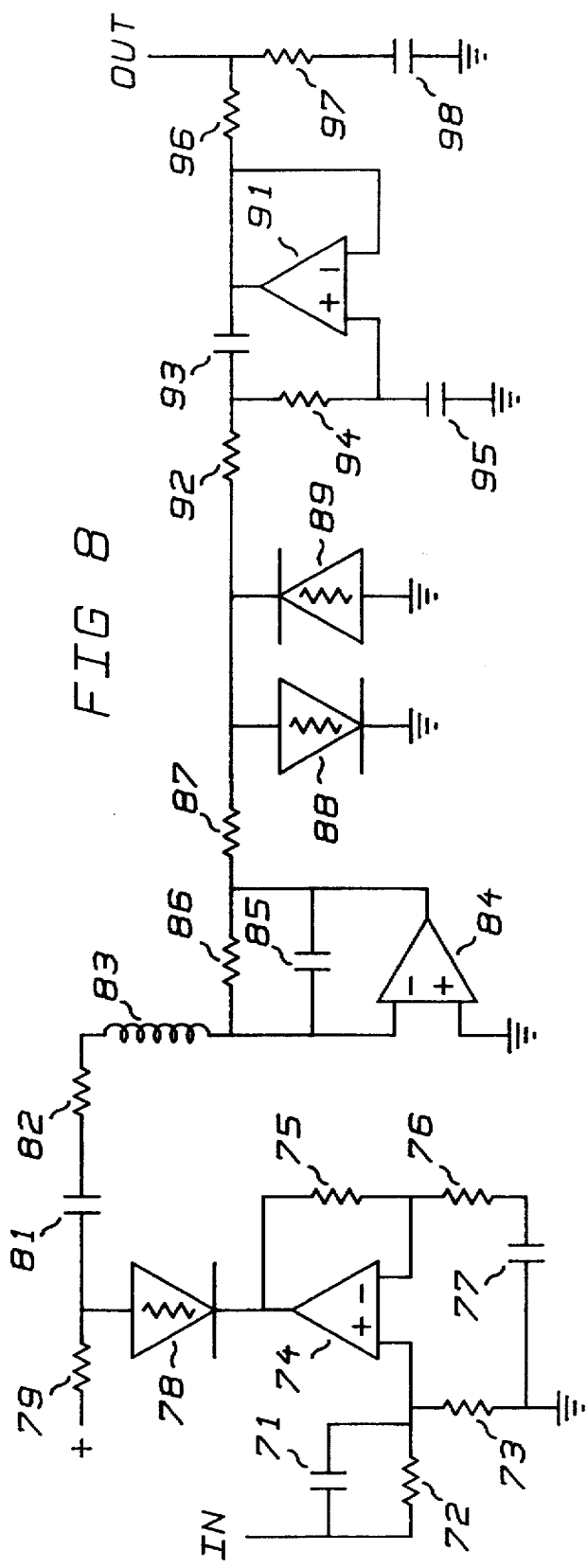
FIG 7
FIG 8

AUDIO PROCESS DISTORTION

CROSS REFERENCE

This is a continuation-in-part of U.S. application Ser. No. 08/281019 filed Jul. 27, 1994, now abandoned.

BACKGROUND OF THE INVENTION

The audio arts have devices which exhibit distortion that changes over the audio spectrum. This distortion is created by vacuum tubes and iron based devices. The distortion variations in vacuum tubes is created by filters required by reactances, in particular inductance or used advantageously to level the average spectra. A constant current through an inductor requires a rising voltage versus frequencies character. Of course, the iron based devices have the well-known B-H curve distortion.

Additionally, tape recording process is squeezed between a maximum recording level as defined by its B-H curve and a noise floor. In order to maximize the signal to noise ratio, the average spectrum of audio, which drops in the high frequencies, allows a treble boost at the input followed by a treble cut at the output.

Transformers create distortion at their lower frequency limits because the low frequencies exercise the B-H curve.

BRIEF DESCRIPTION OF FIGURES

FIG. 7 is the circuit for a spring reverberator.

FIG. 8 is the circuit for a tape recorder emulator.

COMPLEMENTARY FILTER AND DISTORTION MEANS EMBODIMENT

Figure 1:
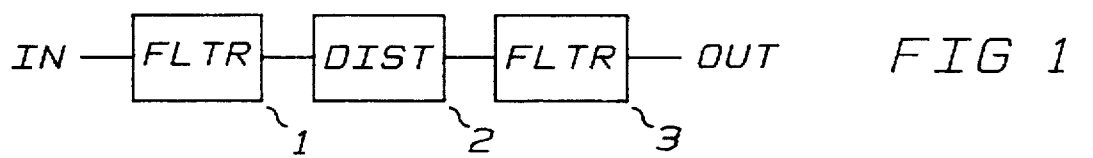
FIG. 1 is a simple example of the invention.

FIG. 1 shows a block diagram of the generic embodiment. The input is passed through a filter 1 and then through a distortion means 2. The result passes through a restoring filter 3 which makes the frequency response approximately flat with optional roll-offs near the audio extremes or beyond.

FIG. 1 shows the input going through a low pass filter 1, an integrator for example. The result is then distorted by distortion means 2. Then the frequency response is restored by a high pass filter 3, a differentiator for example. The low pass filter accentuates the low frequencies so that they will be the dominate components in the distortion process. The high pass filter then restores the frequency response and diminishing the low frequencies more than the high frequency distortion products, particularly the intermodulation products. Thus, the spectrum of the distortion is substantially different from the frequency response.

Although this embodiment is not bilateral, it is similar to the behavior of transformers. Ideal transformers are emulated by a particular low pass filter 1, an integrator, and a particular high pass filter 3, a differentiator and the distortion character of distortion means 2 is that of a B-H curve.

FIG. 1 can be generalized by allowing filter 1 to be any response showing variation in the audio spectrum and filter 3 to be its inverse so as to restore the frequency response to nominally flat. The intervening distortion means operates predominately on the portion of the spectrum accented by filter 1. Filter 3 then removes that accent but transmits much of the distortion and intermodulation products.

The average audio spectrum drops at high frequencies. Consequently, the treble frequencies can be boosted at the input and similarly cut at the output so that the intervening circuitry and process is operating at full capacity. The consequential distortion of the intervening circuitry and process is based upon a treble boosted spectrum. After the treble cut at the output, the distortion spectrum is different than operating without the filters. The first filter could have a response proportional to $(as+1)/(bs+1)$. Then to achieve a flat response the second filter must be complementary: $(bs+1)/(as+1)$.

Similarly, the average audio spectrum drops at low frequencies. Consequently, the input bass frequencies can be accentuated on the input and then attenuated at the output to help minimize hum. In this case, the input filter is proportional to $(s+a)/(s+b)$ and the output filter is proportional to $(s+b)/(s+a)$.

Figure 2:
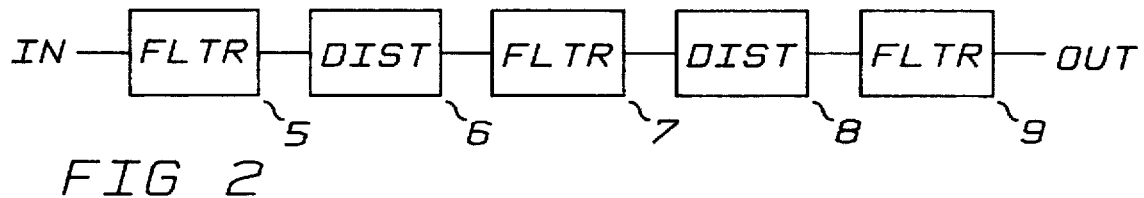
FIG. 2 is an extended example of the invention.

FIG. 2 is a further generation of FIG. 1 that has multiple filtering and multiple intervening distortion means. The filters 5, 7, and 9 nominally form a flat response with the potential of bass and treble roll-offs. The distortion means 6 and 8 replicate distortions such as found in tube and B-H characteristics.

NON-LINEAR MEANS

Figure 3:
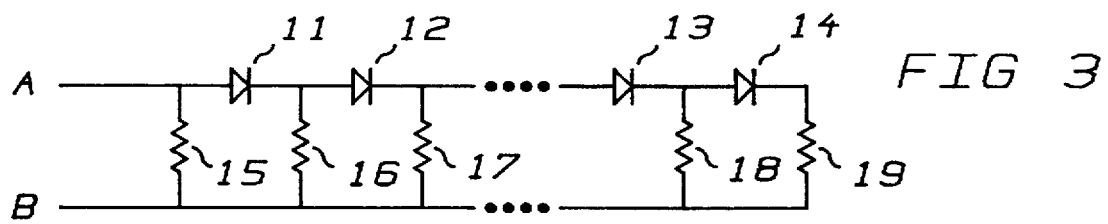
FIG. 3 is a parallel resistor-diode network.
Figure 4:
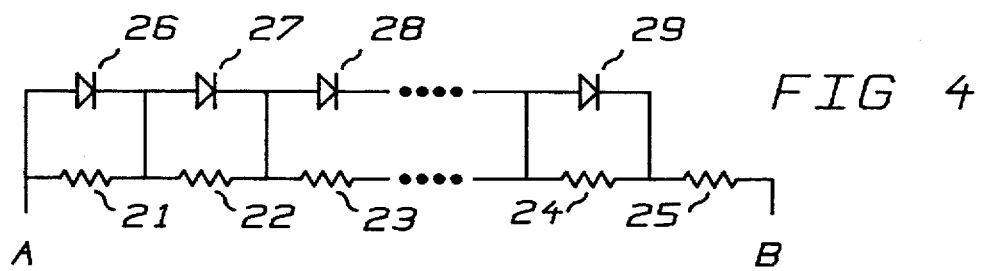
FIG. 4 is a series resistor-diode network.
Figure 5:
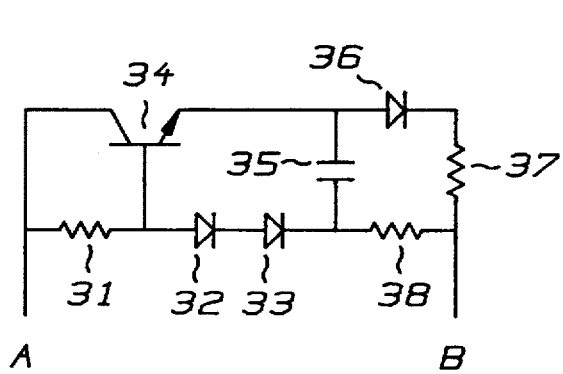
FIG. 5 is a resistor-diode-transistor network.
Figure 6:
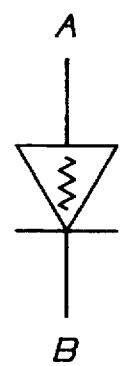
FIG. 6 is the symbol for FIGS. 3–5.

The non-linear networks of FIGS. 3 through 5 are the foundation of the various distortion means above. They are shown by a new symbol, a resistor symbol within an oversized diode symbol, FIG. 6. There are many possible versions of this non-linear network as shown in FIGS. 3 through 5. The terminals A and B of the resistor/diode symbol of FIG. 6 correspond to the terminals A and B in FIGS. 3 through 5. FIG. 3 shows series diodes 11–14 with parallel resistors 15–19 connected as a ladder. As the voltage across terminals A and B rises successive diodes turn on putting additional resistors in parallel. FIG. 4 shows series pairs of parallel resistors 21–24 and diodes 26–29. As the voltage across terminals A and B rises successive diodes turn on and effectively remove resistors from the circuit, starting with the highest value and continuing to the lowest value until the only resistor left is 25, the one without a parallel diode. In either case, the effective resistance from A to B drops as the voltage across A to B increases. This implies that current flowing from A to B flows at an ever increasing rate as said voltage increases. FIG. 5 continues this non-linear characteristic. As the voltage from A to B increases the current through the resistor 31 increases. This current is split through the base-emitter junction and the series diodes 32 and 33. The current through the base-emitter junction of transistor 34 rises faster than through the diodes because the diodes are two junctions in series while the transistor is only a single diode. The bias voltage is fixed by diode 36 so that each path from B to the transistor base has two diode drops. Variations in the junction leakage current are minimized by resistors 37 and 38 which tend to remove the non-linearity of the circuit and makes it behave like a current mirror.

Capacitor 35 keeps the non-linear behavior active above some minimum frequency.

Alternatively, the components 35–38 can be removed and Shottkey diodes be used for diodes 32–33. This is particularly important for networks that are not on most of the time.

Also the current in the resistor 31 can be buffered from terminal A by an emitter follower. The emitter follower collector is connected to a power supply above the maximum signal level.

All of these networks can produce the very desirable second harmonic since they can all perform squaring operations. To that end all the resistors of FIG. 3 are the same value. The resistors of FIG. 4 are proportional to the progression 1, +e,fra 1/3, 1/6, 1/10, 1/15 . . . +ee 2/n(n+1) . . . and the resistor without the parallel diode, the nth, is 2/n. FIG. 5 produces an approximate squaring because there is one junction in the transistors and there are two junctions in the series diodes.

Cubic operations can be done by using the squaring progression of FIG. 4 in FIG. 3. The progression for FIG. 4 is 1, $^{1/4}$/ 1;10, 1/20 . . . 6/n(n+1)(n+2). FIG. 5 can be modified by putting extra diodes in series with diodes 33 and 36. This and other higher order non-linear means is suitable as a shunting network in a lossless B-H characteristic, as disclosed in my earlier U.S. Pat. Nos. 5,133,014 and 4,995,084 which are included herein by reference.

When the cubic characteristic is used in as a shunt the result will include the fundamental, the third harmonic and small amounts of higher order odd harmonics.

SPRING REVERBERATION SYSTEM

The spring reverberation system has a pre-emphasis filter which compensates for its inductive input. The two are separated by an amplifier. Solid state applications use the virtually distortion free operational amplifiers, but tube applications have their distortions. FIG. 7 shows a solid state spring reverberation system using a tube emulator. The spring reverberator 56 is based upon a limited rotation motor and generator that are connected by a spring or spring assembly. Both the motor and the generator use a magnet and an inductive coil. The driver for the motor must overcome the inductance of the motor inductance. This is done by an input filter contained in the input amplifier. The input amplifier is composed of operational amplifier 41, feedback resistor 42, resistor 43 and capacitor 44. The time constant of capacitor 44 and resistors 42 and 43 is approximately that of the drive inductance 54 and the net series resistance 55. This makes the frequency response of the inductor current to the input approximately flat.

The spring reverberator shows a treble roll-off which may optionally be compensated for in part by a treble boost network of resistor 57 and capacitor 58.

The output of operational amplifier goes through a non-linear network 45 which may be any of FIGS. 3–5 and has, preferably, a squaring relationship similar to that of the plate resistance of a vacuum tube as presented in U.S. Pat. No. 5,434,536 and included herein by reference. Resistor 48 acts as the plate load. Capacitor 47 couples the resulting signal to the bias resistor 48 and buffer amplifier 51 which has a low gain set by resistors 52 and 53. The amplifier 51 drives the input coil 54 of the spring reverberator 56 through a net resistance 55.

The spring reverberator recovery amplifier is approximately standard having the recommended termination network composed of capacitor 61 and resistor 62. This drives operational amplifier 63 that has feedback resistor 64, resistor 65 and capacitor 66. Capacitor 66 rolls off the bass to avoid hum picked up by the spring reverberator.

The treble frequencies are distorted far more by the plate resistance emulation non-linear means 45 because the network 43–44 creates far more treble than bass at the output amplifier 41. Although the treble is attenuated by the input inductance 54, the percentage of distortion in the treble frequencies is different. For example, if the amplifier output is raised by the filter by a factor of x then the second harmonic amplitude will be raised by x squared. Then after the compensating filter 54–55 which reduces the signal by 2*x leaving a second harmonic increase of x/2. Third harmonic goes up by x cubed for a net increase of a third of x squared. Thus, the spectrum of the distortion is substantially different than the frequency response.

ANALOG RECORDING EMULATION

FIG. 2 can also be a block diagram of an emulator for the recording process. The input drives a tape pre-emphasis filter 5. This filter drives a tube emulation means 6 that emulates the recording head driver. The recording filter 7 loads the emulation means as recording head and produces a signal similar to the magnetic intensity (H). The distortion means 8 emulates the B-H relationship. The playback filter 9 is a combination high pass filter similar to a differentiator to produce the derivative of the resultant flux and rolled off as a recording head plus the playback compensation and the optional de-emphasis filter.

The pre-emphasis filter 5 compensates for the recording character of the recording head which needs a substantial amount of treble to overcome its inductance. The pre-emphasis filter response may be chosen from one of the many, but similar, standards produced by organizations such as NAB. This filter is shown in FIG. 8 by components 71–79. The input is given a treble pre-emphasis by capacitor 71 and resistors 72 and 73. Preferably the time constant is between 35 to 120 microseconds depending upon the tape speed being emulated. This filter drives operational amplifier 74 that is part of a filter that includes resistors 75 and 76 and capacitor 77. This filter has the same time constant as the inductor circuit 81–83.

The tube emulator 6 is described in my previously issued U.S. Pat. No. 5,434,536 and included herein by reference. The tube emulator distortion produces more distortion of the larger high frequency signals than of the smaller low frequency signals. The amplifier 74 and non-linear means 78 of FIG. 8 form the basic components of a tube emulator needed to emulate the plate resistance characteristic. Resistor 79 is the plate load resistance.

The recording filter 7 loads the tube emulator as a tape head would. This is quite important for the more common triode emulator because the plate resistance interacts with the reactance of the tape head. In FIG. 8 this filter includes components 81 through 86. Capacitor 81 is the coupling capacitor. Resistor 82 is at least the resistance of the inductor 83 which represents the recording head inductance. Operational amplifier 84 and the feedback components 85 and 86 measures and rolls off the head current to emulate eddy currents.

The distortion means 8 produces the distortion associated with the magnetic tape. This distortion means can be lossless as FIGS. 3–5, or more applicable, like FIG. 6 of my earlier U.S. Pat. No. 5,133,014. This symmetrically distorting network is like FIGS. 3 or 4 if there were two anti-parallel diodes for each diode of these figures. The complexity of this type of network is preferred because, according to The Complete Handbook of Magnetic Recording, Third Edition, by Finn Jorgensen, Tab Professional and Reference Books, page 336, a useful guide on distortion is that the one percent distortion level is about 10 dB below tape saturation and the five percent distortion level is about 5 db below tape saturation. This is shown in FIG. 8 as series resistors and shunt non-linear means 88 and 89.

The final filter means 9 is a combination of the playback head response, the compensating filter response, and the playback equalization response. Although there are intervening amplifiers in tape recorders, they operate at sufficiently low levels that their distortion can be ignored. This shown in FIG. 8 as a high-frequency roll-off filter 91 through 95 which is quite well known in the arts. Filter 96 through 98 form the de-emphasis circuit.

Although the desire of analog tape recording equipment is to have a flat response, both tape heads have a treble roll-off. The playback head, in particular, has a treble response similar to the sin(x)/x response. The filter 91–95 emulates this response, although hardly exactly.

Tape recorders typically do not have full 20 Hertz to 20,000 Hertz frequency responses because the induction favors higher frequencies and because head gaps favor lower frequencies.

Consequently, tape recorders and their emulators exhibit a frequency response which is approximately flat over a substantial portion of the audio spectrum.

COMPUTER EMBODIMENT

Figure 9:
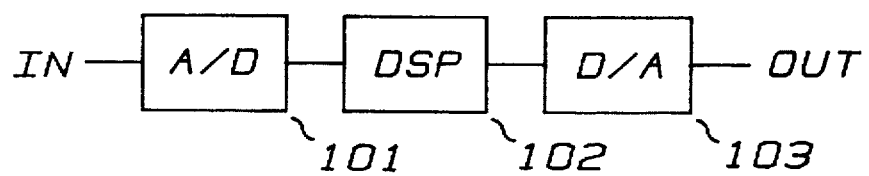
FIG. 9 is a digital embodiment of the system.

This approach has application to the simulation of the analog tape machines to give digital recordings warmth. Notice that this is also readily programmed in digital signal processors such as in FIG. 9. An analog-to-digital converter 101 converts the input to digital values. The digital signal processor 102, a computer, and also known as a DSP, computes the output in response to the input with programs that emulate the filtering and distortion. The digital-to-analog converter 103 converts the output digital values to analog signals. The converters, of course, are only examples of input and output means. The computer arts have many more.

Figure 10:
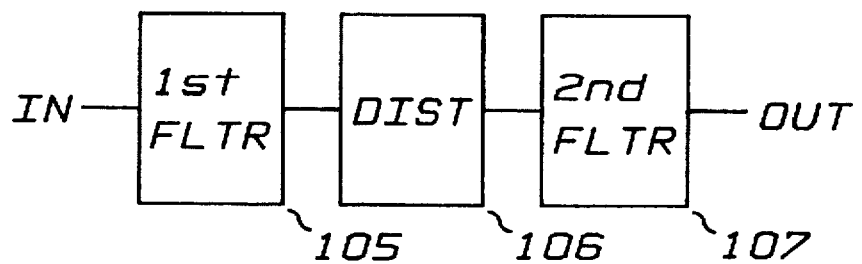
FIG. 10 is a flow chart for said digital embodiment.

The simple program of a pre-emphasis filter, a distortion means, and a de-emphasis filter is shown in FIG. 10. The digital signal programming arts can create filters which have a response proportional to (as+1)/(bs+1) and its complement (bs+1)/(as+1) where a and b are time constants in the audio range. To produce distortion, the computer arts can also readily compute polynomial transfer functions such as the following transfer function:

```
INS  = IN * IN
OUT  = ((C * INS + B) * INS + A) * IN
       where
A    = .57              the first order constant
B    = -.076            the third order constant
C    = .0065            the fifth order constant
```

Although the B-H curve is quite like the arctangent function, according to The Complete Handbook of Magnetic Recording, Third Edition, by Finn Jorgensen, Tab Professional and Reference Books, page 472, the above approximation does work and limits the computational aliasing problem to the fifth harmonic. Considering that the fifth harmonic is quite small, it too can be ignored to reduce the aliasing problem to the third harmonic.

Of course, it is well within the computer arts to have more filters and distortion means.

Although the present invention has been described and illustrated in detail, it is to be clearly understood that the same is by way of illustration and example only, and is not to be taken by way of limitation. The spirit and scope of the present invention are to be limited only by terms of the appended claims:

1. A solid state distortion enhancement means having an input, an output, and a frequency response for creating a distortion enhanced audio signal, said distortion having a frequency spectrum, and comprising:

a plurality of filters connected in series from said input to said output to produce said frequency response which is approximately flat over a substantial portion of the audio range; and one or more solid state distortion devices interconnecting said filter means; wherein the frequency spectrum of said distortion at the output is substantially different than said frequency response;

and wherein at least one of said distortion devices does not have the exponential character of a shunting diode and does not have the symmetrical exponential character of anti-parallel shunting diodes.

2. The enhancement means of claim 1 wherein one of said plurality of filters has a low-pass response and another filter of said plurality of filters has a high pass response.

3. The enhancement means of claim 1 wherein one of said plurality of filters is an integrator and a another filter of said plurality of filters is a differentiator.

4. The enhancement means of claim 1 wherein one of said plurality of filters has the frequency response of the record filter of an audio tape recorder.

5. The enhancement means of claim 1 wherein one of said plurality of filters has the frequency response of the playback filter of an audio tape recorder.

6. The enhancement means of claim 1 wherein one of said plurality of filters is a pre-emphasis filter such as found in analog tape recorders.

7. The enhancement means of claim 6 wherein one of said one or more distortion devices emulates the B-H curve of magnetic material.

8. The enhancement means of claim 1 wherein one of said one or more distortion devices emulates the B-H curve of magnetic material.

9. The enhancement means of claim 1 wherein one of said one or more distortion devices includes the emulation of a vacuum tube plate characteristic.

10. The enhancement means of claim 1 wherein one of said one or more distortion devices includes a resistor and a plurality of diodes connected in series.

11. The enhancement means of claim 10 wherein each of said plurality of series connected diodes has a parallel diode connected in reverse so current will flow in both directions.

12. The enhancement means of claim 10 wherein said plurality of series diodes is connected to parallel resistors connected in a ladder.

13. The enhancement means of claim 10 wherein each of said plurality of series diodes has a parallel resistor.

14. The enhancement means of claim 10 wherein said plurality of diodes is connected across the base-emitter junction of a transistor wherein said combination uses the logarithmic and exponential characteristics of semiconductor junctions to produce a non-linear relationship between the current in the diodes and the current in the transistor.

15. The enhancement means of claim 1 wherein one of said plurality of filters is a spring reverberator.

16. The enhancement means of claim 1 wherein the net response of said plurality of filters includes a bass and/or a treble roll-off.

17. The enhancement means of claim 1 wherein one of said non-linear means has a maximum level, produces approximately one percent distortion at 10 dB below said maximum, and produces approximately 5 percent distortion at 5 dB below said maximum.

18. The enhancement means of claim 1 wherein said input and output are digital values and said first filter, distortion means, and second filter are computer programs operating on said input digital value and producing said output digital value.

19. A solid state distortion enhancement means for creating and enhanced audio signal and having an input and an output comprising:
 a second filter means for producing said output and including a spring reverberator;
 a first filter means responsive to said input having a compensating frequency response to the input circuit of said spring reverberator;
 a distortion means responsive to said first filter means for driving said spring reverberator and for the emulation of the plate resistance of a vacuum tube.

20. A solid state emulation means of an analog audio tape recorder for emulating the signal frequency response and distortion spectra of said recorder and having an input and an output comprising:
 a first filter means responsive to said input having the response of the recording equalizer of said audio tape recorder;
 a first distortion means responsive to said first filter for the emulation of the plate resistance of a vacuum tube;
 a second filter means responsive to said first distortion means for the emulation of the recording magnetic head;
 a second distortion means responsive to said second filter means having the distortion characteristic of magnetic material;
 a third filter for making the overall frequency response approximately flat over a substantial portion of the audio spectrum.

21. The enhancement means of claim 20 wherein one of said non-linear means has a maximum level, produces approximately one percent distortion at 10 dB below said maximum, and produces approximately 5 percent distortion at 5 dB below said maximum.

22. The enhancement means of claim 20 wherein at least one of said distortion devices includes a plurality of series connected diodes.

23. The enhancement means of claim 22 wherein each of said plurality of series connected diodes has a parallel diode connected in reverse so that current will flow in both directions.

24. The enhancement means of claim 22 wherein said plurality of series diodes is connected to parallel resistors connected in a ladder.

25. The enhancement means of claim 22 wherein each of said plurality of series diodes has a parallel resistor.

26. The enhancement means of claim 22 wherein said plurality of diodes is connected across the base-emitter junction of a transistor wherein said combination uses the logarithmic and exponential characteristics of semiconductor junctions to produce a non-linear relationship between the current in the diodes and the current in the transistor.

27. The enhancement means of claim 20 wherein the net response of said plurality of filters includes a bass and/or a treble roll-off.

* * * * *